(12) United States Patent
Polak et al.

(10) Patent No.: US 9,806,689 B2
(45) Date of Patent: Oct. 31, 2017

(54) ELECTRONIC LOCK, LOCKING SYSTEM, METHOD OF OPERATING AN ELECTRONIC LOCK, COMPUTER PROGRAM PRODUCT

(71) Applicant: NXP B.V., Eindhoven (NL)

(72) Inventors: Piotr Polak, Eindhoven (NL); Wilhelmus Hubertus Chretien Knubben, Susteren (NL); Hauke Meyn, Krempermoor (DE)

(73) Assignee: NXP B.V., Eindhoven (NL)

( * ) Notice: Subject to any disclaimer, the term of this patent is extended or adjusted under 35 U.S.C. 154(b) by 44 days.

(21) Appl. No.: 14/258,997

(22) Filed: Apr. 22, 2014

(65) Prior Publication Data
US 2014/0340195 A1 Nov. 20, 2014

(30) Foreign Application Priority Data
May 15, 2013 (EP) .................................... 13167867

(51) Int. Cl.
*G07C 9/00* (2006.01)
*H03G 3/30* (2006.01)
*H03F 3/45* (2006.01)

(52) U.S. Cl.
CPC ......... *H03G 3/301* (2013.01); *G07C 9/00309* (2013.01); *G07C 9/00571* (2013.01); *H03F 3/45071* (2013.01); *G07C 2009/00634* (2013.01); *G07C 2009/00777* (2013.01); *G07C 2009/00793* (2013.01); *H03F 3/45* (2013.01); *H03F 2200/03* (2013.01); *H03F 2203/45528* (2013.01); *H03F 2203/45588* (2013.01)

(58) Field of Classification Search
CPC ........... G07C 2009/00634; G07C 2009/00777; G07C 2009/00793; G07C 9/00309; G07C 9/00571; H03F 2003/45008; H03F 2200/03; H03F 2203/45528; H03F 2203/45588; H03F 3/45071; H03G 3/301
See application file for complete search history.

(56) References Cited

U.S. PATENT DOCUMENTS 7,446,644 B2 * 11/2008 Schaffzin ........... G07C 9/00182
340/5.6
7,880,584 B2 * 2/2011 Larson ............... G07C 9/00103
340/5.2

(Continued)

FOREIGN PATENT DOCUMENTS

CN 101887600 A 11/2010
CN 103095735 A 5/2013

(Continued)

OTHER PUBLICATIONS

Extended European Search Report for EP Patent Appln. No. 13167867.4 (Oct. 13, 2013).

*Primary Examiner* — Sisay Yacob

(57) ABSTRACT

According to an aspect of the invention, an electronic lock is conceived, being adapted to harvest energy from a radio frequency (RF) connection established between a mobile device and said electronic lock, further being adapted to use the harvested energy for processing an authorization token received via said RF connection from the mobile device, and further being adapted to use the harvested energy for controlling an unlocking switch in dependence on a result of said processing.

15 Claims, 3 Drawing Sheets

(56) References Cited

U.S. PATENT DOCUMENTS

| | | | |
|---|---|---|---|
| 2002/0180582 A1* | 12/2002 | Nielsen | G07C 9/00103 340/5.6 |
| 2003/0117900 A1* | 6/2003 | Fujisawa | G04B 37/0008 368/47 |
| 2004/0219903 A1* | 11/2004 | Despain | G07C 9/00023 455/410 |
| 2007/0056338 A1* | 3/2007 | Sabo | E05B 63/18 70/257 |
| 2007/0090921 A1* | 4/2007 | Fisher | G07C 9/00103 340/5.73 |
| 2007/0096870 A1* | 5/2007 | Fisher | E05B 19/0005 340/5.53 |
| 2007/0290798 A1* | 12/2007 | Larson | G07C 9/00103 340/5.73 |
| 2007/0296545 A1 | 12/2007 | Clare | |
| 2008/0246587 A1* | 10/2008 | Fisher | A47G 29/10 340/5.73 |
| 2009/0066476 A1* | 3/2009 | Raheman | G07C 9/00103 340/5.64 |
| 2009/0183541 A1* | 7/2009 | Sadighi | G07C 9/00103 70/263 |
| 2010/0201482 A1* | 8/2010 | Robertson | G07C 9/00904 340/5.61 |
| 2010/0283579 A1* | 11/2010 | Kraus | G07C 9/00944 340/5.7 |
| 2011/0260839 A1* | 10/2011 | Cook | G06K 19/0708 340/10.4 |
| 2012/0270496 A1 | 10/2012 | Kuenzi et al. | |
| 2014/0149742 A1* | 5/2014 | Yau | H04L 63/083 713/159 |
| 2014/0149746 A1* | 5/2014 | Yau | G06F 21/35 713/185 |
| 2014/0156993 A1* | 6/2014 | Yau | H04L 63/083 713/168 |

FOREIGN PATENT DOCUMENTS

| | | |
|---|---|---|
| DE | 196 21 909 A1 | 12/1997 |
| EP | 2 071 522 A1 | 6/2009 |
| JP | 10-025935 A | 1/1998 |
| JP | 2007-308873 A | 11/2007 |
| JP | 2010-144428 A | 7/2010 |
| JP | 2011-024290 A | 2/2011 |
| JP | 2011-256567 A | 12/2011 |
| WO | 2005/078667 A1 | 8/2005 |

* cited by examiner

ELECTRONIC LOCK, LOCKING SYSTEM, METHOD OF OPERATING AN ELECTRONIC LOCK, COMPUTER PROGRAM PRODUCT

CROSS-REFERENCE TO RELATED APPLICATIONS

This application claims the priority under 35 U.S.C. §119 of European patent application no. 13167867.4, filed on May 15, 2013, the contents of which are incorporated by reference herein.

FIELD OF THE INVENTION

The invention relates to an electronic lock. Furthermore, the invention relates to a locking system. Furthermore, the invention relates to a method of operating an electronic lock. Furthermore, the invention relates to a computer program product.

BACKGROUND OF THE INVENTION

Nowadays, electronic locks are used for controlling access to a variety of objects, such as buildings, rooms and vehicles. One type of electronic locks is based on radio frequency (RF) technology, by means of which an RF connection may be established between an access device, e.g. an electronic key, and an electronic circuit within a lock, in order to execute an authorization and unlocking procedure. For example, a popular type of RF technology is the so-called near field communication (NFC) technology. In general, NFC refers to a set of standards for smart phones and similar devices to establish radio communication with each other by touching them together or by bringing them into close proximity of each other, usually no more than a few centimeters.

However, currently available NFC-enabled locks, e.g. hotel room door locks, typically require the integration of an NFC reader device into a lock or a door. In this case, the NFC reader constantly pulls for an access device, e.g. a contactless smart card used as a key replacement, which causes a quick drowning of the battery. Furthermore, the smart card which replaces the key has to be programmed via an NFC interface by a system operator and its settings cannot be changed remotely.

SUMMARY OF THE INVENTION

It is an object of the invention to reduce the power consumption of electronic locks of the kind set forth. This object is achieved by an electronic lock as defined in claim 1, a locking system as defined in claim 10, a method of operating an electronic lock as defined in claim 12, and a computer program product as defined in claim 13.

According to an aspect of the invention, an electronic lock is conceived, being adapted to harvest energy from a radio frequency (RF) connection established between a mobile device and said electronic lock, further being adapted to use the harvested energy for processing an authorization token received from the mobile device via said RF connection, and further being adapted to use the harvested energy for controlling an unlocking switch in dependence on a result of said processing.

According to an illustrative embodiment of the invention, the electronic lock comprises an energy storage unit, in particular a capacitor, which is adapted to store the harvested energy.

According to a further illustrative embodiment of the invention, the electronic lock comprises a secondary antenna which is adapted to harvest the energy from the RF connection.

According to a further illustrative embodiment of the invention, the electronic lock is enabled for near field communication (NFC) such that said RF connection may be an NFC connection.

According to a further illustrative embodiment of the invention, the electronic lock is further adapted to process the authorization token by transmitting the authorization token to an authorization server via a further RF connection, and to control the unlocking switch by enabling the unlocking switch upon or after receipt of a response indicative of a positive verification of the authorization token from the authorization server.

According to a further illustrative embodiment of the invention, the electronic lock comprises a low-power RF transceiver which is adapted to establish the further RF connection.

According to a further illustrative embodiment of the invention, the electronic lock comprises a secure element which is adapted to store the authorization token, to encrypt the authorization token before the electronic lock transmits the authorization token to the authorization server, and to decrypt the response from the authorization server.

According to a further illustrative embodiment of the invention, the electronic lock is further adapted to participate in a first authentication process for establishing secure communication with the mobile device, and to participate in a second authentication process for establishing secure communication with the authorization server.

According to a further illustrative embodiment of the invention, the electronic lock comprises a secure element which is adapted to process the authorization token by verifying said authorization token and to enable the unlocking switch upon or after a positive verification of the authorization token.

According to a further aspect of the invention, a locking system is conceived, which comprises an electronic lock of the kind set forth, a mobile device and an authorization server.

According to a further illustrative embodiment of the invention, the mobile device is adapted to request the authorization token from the authorization server via a separate communication channel.

According to a further aspect of the invention, a method of operating an electronic lock is conceived, wherein said electronic lock harvests energy from a radio frequency (RF) connection established between a mobile device and said electronic lock, wherein the electronic lock uses the harvested energy for processing an authorization token received from the mobile device via said RF connection, and wherein the electronic lock uses the harvested energy for controlling an unlocking switch in dependence on a result of said processing.

According to a further aspect of the invention, a computer program product is conceived, which comprises instructions executable by an electronic lock, wherein said instructions, when being executed by said electronic lock, carry out or control steps of a method of the kind set forth.

BRIEF DESCRIPTION OF THE DRAWINGS

The invention will be described in more detail with reference to the appended drawings, in which.

DESCRIPTION OF EMBODIMENTS

In accordance with the present disclosure, an unlocking switch comprised in an electronic lock is powered by the energy harvested from an RF field generated by a mobile device, or, in other words, from an RF connection between the mobile device and the electronic lock. The same RF connection may be used to exchange authorization data, in particular an authorization token, between the mobile device and the electronic lock. The RF connection may, for example, be an NFC connection. Since NFC requires close proximity between communicating devices, the NFC connection is inherently secure, to a certain extent, and therefore the overall security of the locking system may increase.

Figure 1:
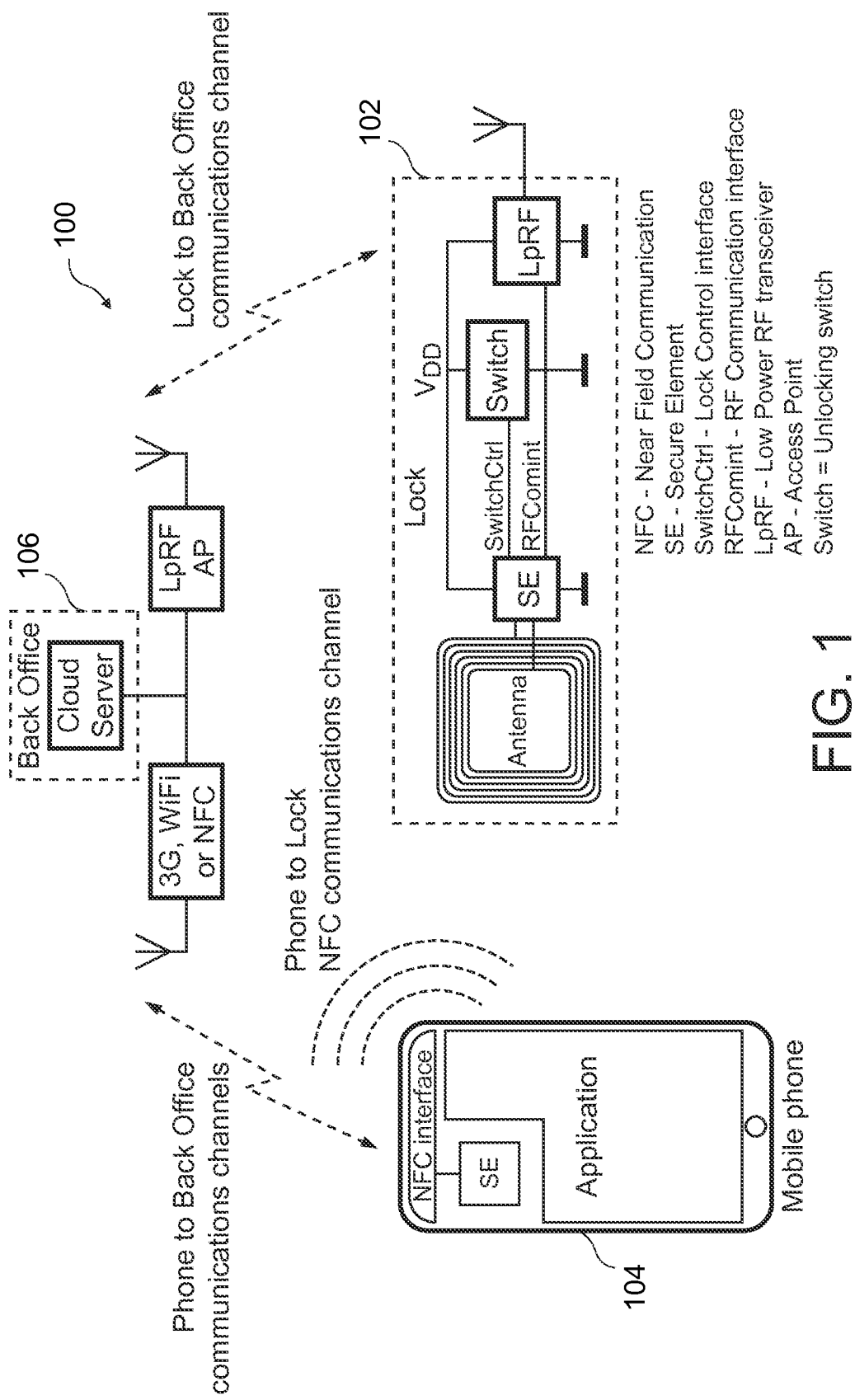
FIG. 1 shows an example of a locking system.

FIG. 1 shows an example of a locking system. The locking system 100 comprises an electronic lock 102, a mobile phone 104 acting as a mobile device of the kind set forth, and a cloud server 106 acting as an authorization server of the kind set forth. In operation, the lock 102 harvests energy from the RF connection between the phone 104 and the lock 102. In this example, the lock 102 uses the harvested energy for transmitting an authorization token received, via the RF connection, from the phone 104, to the cloud server 106 via a further RF connection. Upon or after successful verification of the authorization token by the cloud server 106, the lock 102 uses the harvested energy for enabling an unlocking switch within said lock 102. Typical examples of relatively simple authorization tokens are passwords and personal identification numbers, but also more complex authorization tokens may be envisaged. In this example, the authorization server verifies the authorization token. Alternatively, the secure element comprised in the lock 102 may verify the authorization token and enable the unlocking switch upon or after a positive verification of the authorization server.

The unlocking switch may be an electronic switch that does not require more power than the energy harvested from the RF connection. Likewise, the further RF connection may be established by a low-power RF transceiver, which may not require more power than the energy harvested from the RF connection. Therefore, at least the presently disclosed elements of the lock 102 require no battery-supplied power. However, in order to ensure a stable power supply an energy storage unit may be used.

Energy harvesting can be integrated into the secure element or implemented as external energy harvesting circuit, for example. Optionally, if additional energy or a more stable power supply is required to operate the unlocking switch or the low-power RF transceiver, an energy storage unit (shown in FIG. 2) may be integrated into the lock 102. For example, a capacitor may be used for this purpose. The capacitor may first be charged from the RF field, and subsequently it may be discharged in order to provide additional energy for enabling the functions of the lock 102. The lock 102 shown in FIG. 1 comprises a single antenna for performing (authorization) data exchange and energy harvesting. The energy necessary to power on the lock is harvested from the RF field using a single antenna attached to the secure element. The secure element may harvest and convert the energy into the required voltage supply to power on the unlocking switch and the low-power RF transceiver. Thus, in this case, the same antenna is used for communication and power supply. Optionally, a secondary antenna may be added for the purpose of energy harvesting.

Figure 2:
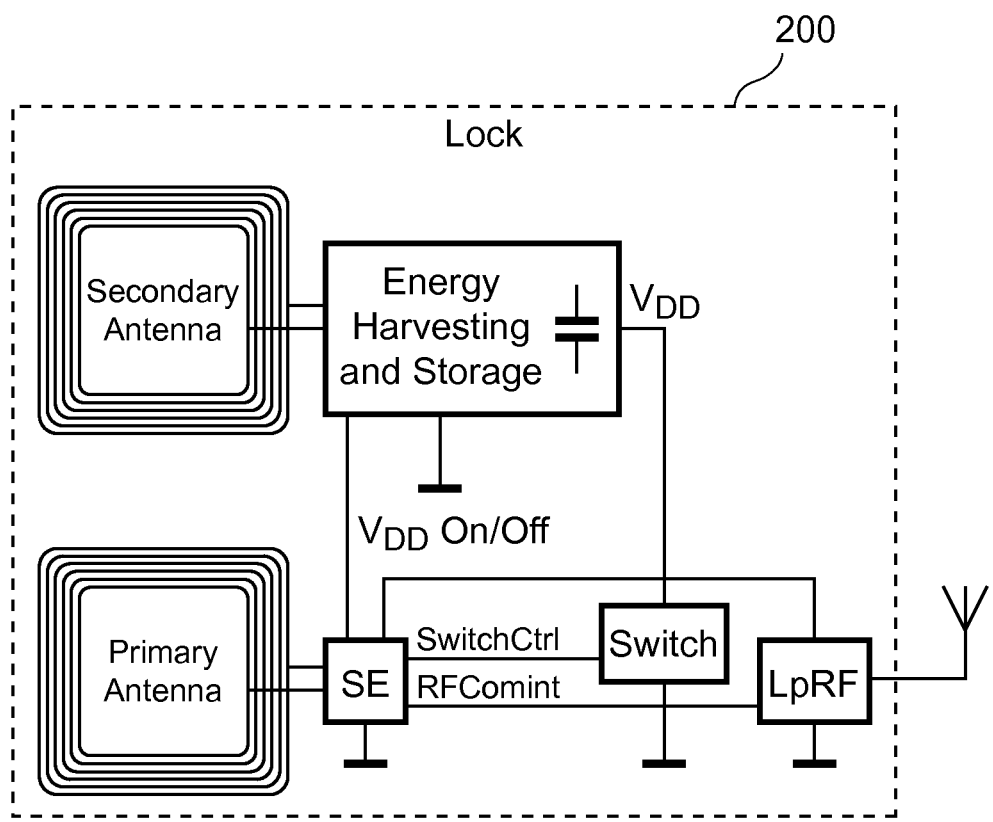
FIG. 2 shows an example of an electronic lock with a secondary antenna.

FIG. 2 shows an example of an electronic lock with a secondary antenna. The electronic lock 200 comprises, in addition to the elements shown in FIG. 1, a secondary antenna and an energy harvesting and storage unit. The energy harvesting and storage unit comprises a capacitor which is adapted to store the harvested energy. The primary antenna is connected to the secure element and is used for communication only. The secondary antenna is connected to the energy harvesting and storage unit, which is external to the secure element and which is used to power on the lock 200. Alternatively, the energy harvesting and storage unit may be implemented within the secure element. In this case, the secure element will be connected to both the primary antenna and the secondary antenna.

Figure 3:
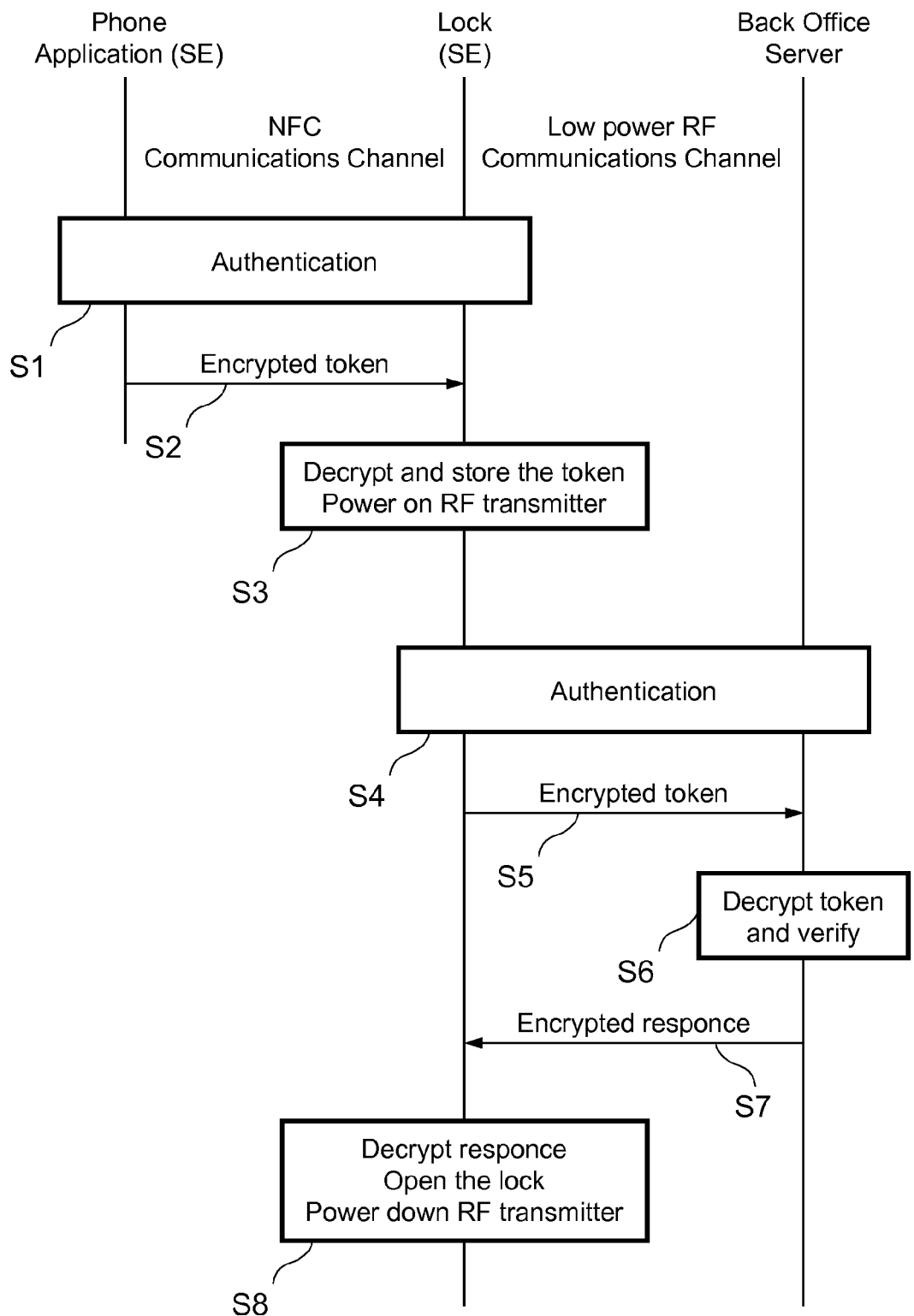
FIG. 3 shows an example of a method of operating an electronic lock.

FIG. 3 shows an example of a method of operating an electronic lock. In a first step S1, a first authentication process is performed, i.e. an authentication process between the mobile device and the electronic lock. It is noted that the mobile device may comprise a software-implemented application (e.g. a so-called "app") which executes the presently disclosed functions of the mobile device, for example the first authentication process. In a second step S2, the mobile device transmits the authentication token in encrypted form via the RF connection to the electronic lock, provided that the first authentication process was successful. It is noted that, in this example, the RF connection is an NFC connection. Subsequently, in a third step S3, the secure element comprised in the electronic lock decrypts the received authorization token and stores it. Subsequently, in a fourth step S4, a second authentication process is performed, i.e. an authentication process between the electronic lock and the authentication server. In a fifth step S5, the secure element encrypts the authorization token and transmits it in encrypted form via the further RF connection to the authorization server, provided that the second authentication process was successful. Subsequently, in a sixth step S6, the authorization server decrypts the authorization token and verifies the authorization token. In a seventh step S7, if the verification result is positive, the authorization server will transmit an encrypted response indicative of the positive verification to the electronic lock via the further RF connection. Finally, in an eighth step S8, the electronic lock decrypts the response, inspects its contents and controls the unlocking switch in accordance therewith in order to open the lock. At this stage, the RF transceiver which is used to establish the further RF connection may be powered down in order to save more energy.

As mentioned above, prior to the data transmission via the RF connection an authentication process can be performed between the mobile device's application and the lock's secure element. If the authentication is successful, the secure channel will be established, which allows encrypted data to be exchanged between the application and the secure element. The encrypted authorization token may then be received, decrypted and stored by the secure element. In order to send the authorization token to the authorization server, i.e. the back-office cloud server, the low-power RF transmitter is powered on by the secure element (via $V_{DD}$ On/Off) to set up the further RF connection. A new authentication process may then be started between the lock and the authorization server. The authorization token may be encrypted again and transmitted to the authorization server for verification. If the verification is positive, a response indicative of said result is sent back over the same channel, i.e. the further RF connection, and the lock may be opened by enabling the unlocking switch. Subsequently, the lock may bring the RF transceiver back to power-down mode. In this way, the power consumption of the lock may be reduced significantly. Furthermore, the authentication server operator is able to release the authorization assigned to the token at any point in time, thereby making the server verification fail, and as a result preventing a user from opening the lock. Thus, in addition to saving power, the electronic lock enables a more flexible authorization policy in case the authorization server is used to verify the authorization token.

The mobile device's application may connect to the authorization server via a separate, wireless communication channel (e.g. a 3G cellular communication channel, a Wi-Fi channel or an NFC channel, as shown in FIG. 1) at least once in order to acquire the authorization token. This may also be done via an internet connection. An authentication process and encryption/decryption of the authorization token between said application and the authorization server may also be required to enable secure communication over the public networks. If available, a secure element embedded in the mobile device may be used to secure keys and data, i.e. the authorization token.

Finally, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

The above-mentioned embodiments illustrate rather than limit the invention, and the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. The invention may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE NUMBERS

100 locking system
102 electronic lock
104 mobile phone
106 cloud server
200 electronic lock
S1 first step
S2 second step
S3 third step
S4 fourth step
S5 fifth step
S6 sixth step
S7 seventh step
S8 eighth step

The invention claimed is:

1. An electronic lock,
being adapted to harvest energy from a radio frequency, RF, connection established between a mobile device and said electronic lock,
further being adapted to use the harvested energy for processing an authorization token received from the mobile device via said RF connection,
and further being adapted to use the harvested energy for controlling an unlocking switch in dependence on a result of said processing,
wherein the electronic lock comprises a secure element configured to decrypt the authorization token and to encrypt the decrypted authorization token before transmitting the encrypted authorization token for authorization.

2. The electronic lock as claimed in claim 1,
comprising an energy storage unit, in particular a capacitor, which is adapted to store the harvested energy.

3. The electronic lock as claimed in claim 1,
comprising a secondary antenna which is adapted to harvest the energy from the RF connection.

4. The electronic lock as claimed in claim 1,
being enabled for near field communication, NFC, such that said RF connection may be an NFC connection.

5. The electronic lock as claimed in claim 1,
further being adapted to process the authorization token by transmitting the authorization token to an authorization server via a further RF connection,
further being adapted to control the unlocking switch by enabling the unlocking switch upon or after receipt of a response indicative of a positive verification of the authorization token from the authorization server.

6. The electronic lock as claimed in claim 5,
comprising a low-power RF transceiver which is adapted to establish the further RF connection.

7. The electronic lock as claimed in claim 5,
wherein the secure element is adapted to store the decrypted authorization token, to encrypt the decrypted authorization token before the electronic lock transmits the encrypted authorization token to the authorization server, and to decrypt the response from the authorization server.

8. The electronic lock as claimed in claim 5,
further being adapted to participate in a first authentication process for establishing secure communication with the mobile device,
and further being adapted to participate in a second authentication process for establishing secure communication with the authorization server.

9. The electronic lock as claimed in claim 1,
wherein the secure element is adapted to process the authorization token by verifying said authorization token and to enable the unlocking switch upon or after a positive verification of the authorization token.

10. A locking system comprising an electronic lock as claimed in claim 1, a mobile device and an authorization server.

11. The locking system as claimed in claim 10,
wherein the mobile device is adapted to request the authorization token from the authorization server via a separate communication channel.

12. The electronic lock as claimed in claim 1, wherein the electronic lock comprises:
a primary antenna configured to communicate with the mobile device for receiving the authorization token; and a secondary antenna configured to harvest the energy from the RF connection.

13. A method of operating an electronic lock, wherein said electronic lock harvests energy from a radio frequency, RF, connection established between a mobile device and said electronic lock, wherein the electronic lock uses the harvested energy for processing an authorization token received from the mobile device via said RF connection, wherein the electronic lock uses the harvested energy for controlling an unlocking switch in dependence on a result of said processing, and wherein the electronic lock decrypts the authorization token and encrypts the decrypted authorization token before transmitting the encrypted authorization token for authorization.

14. A non-transitory computer program product comprising instructions executable by an electronic lock, wherein said instructions, when being executed by said electronic lock, carry out or control steps of a method as claimed in claim 13.

15. The electronic lock as claimed in claim 12, wherein the electronic lock further comprises a third antenna configured to transmit the authorization token to an authorization server.

* * * * *